ns Cited
U.S. PATENT DOCUMENTS

United States Patent [19]
Yoshikawa et al.

[11] 4,127,414
[45] Nov. 28, 1978

[54] PATTERN-FORMING MATERIALS HAVING A RADIATION SENSITIVE CHALCOGENIDE LAYER AND A METHOD OF FORMING PATTERNS WITH SUCH MATERIALS

[75] Inventors: Akira Yoshikawa, Tokorozawa; Haruo Nagai, Kawasaki; Osamu Ochi, Kodaira; Kazuko Nakano, Machida; Yoshihiko Mizushima, Fuchu, all of Japan

[73] Assignee: Nippon Telegraph and Telephone Public Corporation, Tokyo, Japan

[21] Appl. No.: 804,659

[22] Filed: Jun. 8, 1977

[30] Foreign Application Priority Data

Jun. 8, 1976 [JP] Japan .................................. 51-66879
Nov. 12, 1976 [JP] Japan ................................ 51-136070

[51] Int. Cl.² .......................... G03C 1/76; G03C 1/00; G03C 5/00

[52] U.S. Cl. ............................................ 96/67; 96/35; 96/36; 96/88; 252/501

[58] Field of Search .......................... 96/36, 35, 67, 88; 427/35, 53; 252/501

[56] References Cited

U.S. PATENT DOCUMENTS 3,707,372  12/1972  Hallman et al. ......................... 96/35

*Primary Examiner*—Edward C. Kimlin
*Attorney, Agent, or Firm*—Sughrue, Rothwell, Mion, Zinn and Macpeak

[57] ABSTRACT

A pattern-forming material comprises a substrate and a radiation sensitive chalcogenide layer disposed thereon. The radiation sensitive chalcogenide layer consists of an amorphous layer having a chemical composition of 75 to 95 mol% of selenium and 5 to 25 mol% of germanium and a silver layer superimposed thereon. The pattern-forming materials having the radiation sensitive chalcogenide layer of the invention are particularly useful in lithographic applications.

3 Claims, 16 Drawing Figures

FIG._1
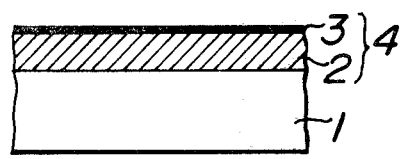
FIG._2
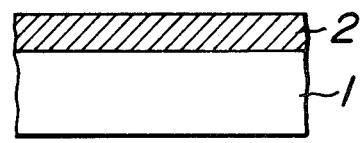
FIG._3
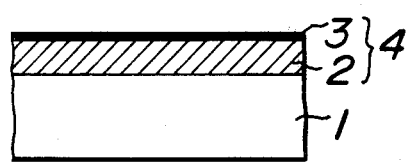
FIG._4
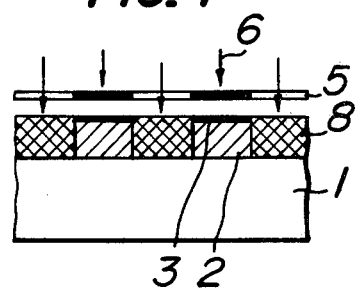
FIG._5
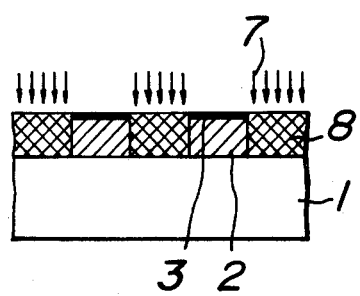
FIG._6
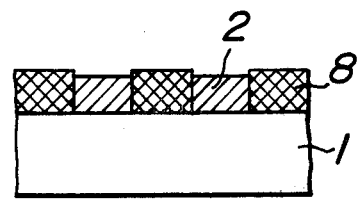
FIG._7
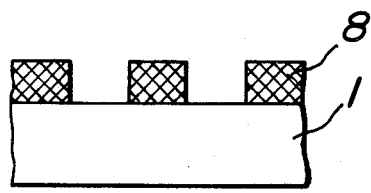

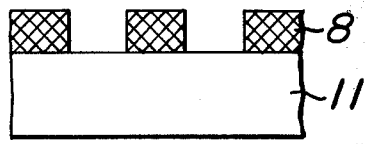
FIG._8
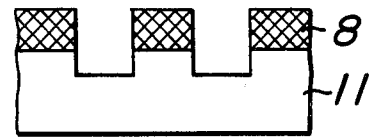
FIG._9
FIG._10
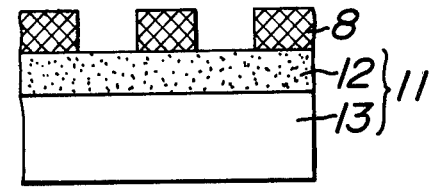
FIG._11
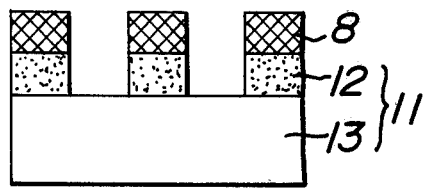
FIG._12
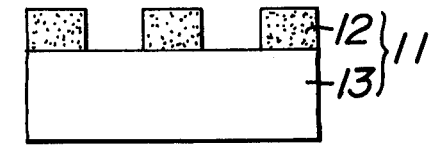
FIG._13

PATTERN-FORMING MATERIALS HAVING A RADIATION SENSITIVE CHALCOGENIDE LAYER AND A METHOD OF FORMING PATTERNS WITH SUCH MATERIALS

BACKGROUND OF THE INVENTION

1. Field of the Invention:

The present invention relates to photo- and electron-resists to be used in various microfabrications for the manufacture of semiconductor elements, integrated circuits and the like and a method of forming patterns with such resists.

2. Description of the Prior Art:

With the advance of microminiaturization and high-density integration of semiconductor elements, integrated circuits and the like, high performance resists for microfablication are demanded and many studies and developments are actively being made. However, resist materials including presently used photoresists are almost composed of organic polymer substances and there is not attempted a development of practical resist materials composed of inorganic substances other than the proposal of utilizing radiation sensitivity of chalcogenide materials as described below.

In general, the resist materials are required to have such fundamental functions that the solubility in a solvent is changed by irradiation of light, electron beam or the like and that they serve as a protective coating during the etching of the material to be worked. For this purpose, there are used two embodiments of resists composed of chalcogenide materials as proposed in U.S. Pat. No. 3,637,377 and No. 3,762,325. Firstly, a laminated thin film of an inorganic substance (mainly, chalogenide) and a metal is used as a radiation sensitive material, and secondarily, chalcogenide material is used alone. In any case, areas exposed to radiation are removed by etching or peeling off. That is, the photographic sensitivity is so-called positive. Further, the chalcogenide materials used contain arsenic as a main ingredient, a typical example of which is arsenic trisulfide ($As_2S_3$).

These prior arts have the following drawbacks. That is, in the first embodiment, the chalcogenide material contains arsenic as the main ingredient and the exposed area is removed by etching, so that a high resolution cannot be obtained owing to the poor etched state. Further, the sensitivity and contrast as the radiation sensitive material are low. Moreover, the chalcogenide material is easily soluble in an alkaline solution, so that it cannot be applied to the processing with an alkali as an etchant. Particularly, since arsenic is a typical donor impurity against silicon, there is a contamination problem in the application for the manufacture of silicon semiconductor elements. When the inorganic substance layer and the metal layer are formed by vacuum evaporation as described in U.S. Pat. No. 3,637,377, undesirable reaction is caused between the inorganic substance and the metal by a light emitted from the evaporating sources during the evaporation.

In the second embodiment, there is a serious drawback that the difference of solubility between the exposed area and the non-exposed area is only by about two times. Further, there are such drawbacks that the etched state is poor and the sensitivity and contrast are low.

SUMMARY OF THE INVENTION

An object of the present invention is to provide novel pattern-forming materials sensitive to light and electron beam which eliminate the above mentioned drawbacks of the conventional radiation sensitive materials using the chalcogenide material, and a method of forming patterns with such novel materials.

According to the present invention, the chalcogenide material is composed of an amorphous thin film composed of selenium and germanium and a silver layer superimposed thereon. Particularly, the present invention is based on the phenomenon that when the two-layer structure of the amorphous thin film and the silver thin layer is exposed to light or electron beam, silver is diffused into the selenium-germanium thin film and as a result, the resulting silver doped selenium-germanium film is insoluble in an alkaline solution.

That is, the pattern-forming material according to the present invention comprises a substrate and a radiation sensitive chalcogenide layer disposed on the substrate and consisting of an amorphous layer having a chemical composition of 75–95 mol% of selenium and 5–25 mol% of germanium and a silver layer superimposed on the amorphous layer. The two-layer structure of the selenium-germanium amorphous layer and the silver layer satisfies the above mentioned fundamental functions as the resist material and has a high resolution, a strong acid resistance, wide applications and the like.

BRIEF DESCRIPTION OF THE DRAWINGS

The invention will now be described in greater detail with reference to the accompanying drawings, wherein:

FIG. 1 is a diagrammatically cross-sectional view of an embodiment of the pattern-forming material having the radiation sensitive chalcogenide layer according to the present invention;

FIGS. 2 to 7 are diagrammatically cross-sectional views of an embodiment in various stages of pattern formation by a method according to the present invention;

FIGS. 8 to 10 and 11 to 13 are diagrammatically cross-sectional views of another embodiments in various stages of pattern formation by a method according to the present invention, respectively;

DETAILED DESCRIPTION OF PREFERRED EMBODIMENTS

Figure 14:
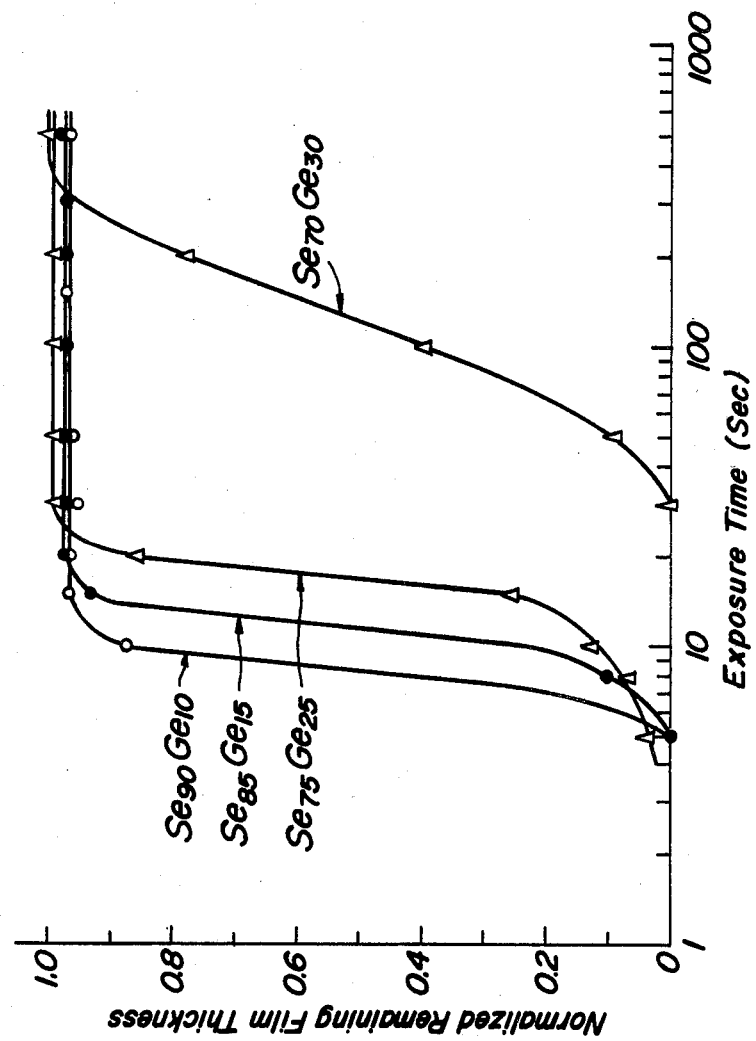
FIG. 14 is a characteristic graph showing a relation between the exposure time and the normalized remaining film thickness of the radiation sensitive chalcogenide layer used in the present invention upon irradiation of light.

The pattern-forming material according to the present invention consists of a substrate 1, a selenium-germanium amorphous thin film 2 disposed on the substrate, and a silver thin layer 3 superimposed on the thin film as shown in FIG. 1. The two-layer structure of the selenium-germanium amorphous thin film 2 and the silver layer 3 is sensitive to light or electron beam irradiation and forms a radiation sensitive chalcogenide layer 4.

The substrate 1 is selected from very wide materials in compliance with the applications of the pattern-forming material and includes, for example, glass; semiconductor materials such as silicon, a laminate of silicon and silicon oxide film, a laminate of silicon and silicon nitride film and the like; metals such as aluminum, molybdenum, tungsten, permalloy and the like; plastics and the like.

The selenium-germanium amorphous thin film has a chemical composition of 75–95 mol% of selenium and 5–25 mol% of germanium.

The thickness of the silver layer is less than 100 Å in case of using as the material for light radiation and is allowed to become thicker than the above value in case of using as the material for electron beam irradiation.

The selenium-germanium amorphous thin film may be formed by conventional techniques, for example, by vacuum evaporation process or by sputtering process. In order to obtain the good adhesion to the substrate, and to achieve the good step covering state when substrates have an uneven surface, the sputtering process is preferable rather than the vacuum evaporation process.

In the formation of the silver layer, an electro-chemical process is most effective. That is, the silver layer having a thickness of less than 100 Å may be reproducibly formed by immersing in a solution containing silver ion, such as aqueous solution of silver nitrate ($AgNO_3$) and the like. An electroless plating solution consisting mainly of silver cyanide (AgCN) is also applicable to this process. Further, the electroplating of silver may be effected. However, the vacuum evaporation of silver does not give a good result as the formation of the silver layer because silver is frequently diffused into the selenium-germanium amorphous thin film by a light emitted from the evaporating source.

The method of forming patterns according to the present invention will be described below with respect to the formation of a given relief pattern on the silver doped selenium-germanium film disposed on the substrate by irradiation of light or electron beam.

At first, a selenium-germanium amorphous thin film 2 with a given thickness is formed on a substrate 1 as shown in FIG. 2. The thickness of this film is determined depending upon the use purpose and is within a range of several tens of angstroms to several microns. Thereafter, a silver layer 3 is formed on the film 2 in the above mentioned process to form a radiation sensitive chalcogenide layer 4 as shown in FIG. 3. Then, the resulting chalcogenide layer is exposed to a light through an optical mask 5 having a given pattern as shown in FIG. 4 or an electron beam according to the given pattern as shown in FIG. 5. In the figures, numeral 6 represents a light and numeral 7 is an electron beam. In any case, silver is diffused into the selenium-germanium film at the areas exposed to the light or electron beam to form silver doped regions 8 corresponding to the given pattern. Next, the silver layer at non-exposed areas is dissolved off by etching with an acid solution such as aqua regia, nitric acid or the like, whereby a pattern composed of silver doped regions of the selenium-germanium film and having no silver layer is formed according to the given pattern as shown in FIG. 6. The selenium-germanium film is hardly soluble in the acid solution such as aqua regia or nitric acid independently of the presence or absence of doping silver, so that the etching treatment with the acid solution dissolves off only the silver layer. Moreover, the selenium-germanium film at non-exposed areas other than the silver doped regions is dissolved off by etching with an aqueous solution of an alkali such as potassium hydroxide (KOH), sodium hydroxide (NaOH), ammonium hydroxide ($NH_4OH$), dimethylamine (($CH_3$)$_2$NH) and the like. Since the exposed areas are doped with silver, they cannot be dissolved off with the above described alkaline solution. Therefore, as shown in FIG. 7, a relief pattern composed of the silver doped regions and corresponding to the given pattern is formed on the substrate by the etching treatment with the alkaline solution. In this alkaline etchant, an addition of an organic solvent such as acetone, ethyl alcohol and the like is effective for improving the etchability of the selenium-germanium film.

Another embodiment of the method according to the present invention will be described below. This embodiment is concerned with the method of forming a given relief pattern on a plate body composed of at least one layer by using the radiation sensitive chalcogenide layer composed of the selenium-germanium amorphous thin film and the silver layer as a photoresist or an electron resist.

In this embodiment, the plate body 11 to be worked is used instead of the substrate 1 in the first embodiment shown in FIGS. 2–7. On the surface of the plate body 11 are formed silver doped regions 8 of the selenium-germanium film according to a given pattern by the above mentioned pattern-forming method (FIG. 8). As the plate body, use may be made of glass, rock crystal, semiconductor materials such as silicon and the like, and various metals. Then, when the etching is carried out with an etchant dissolving only the plate body, portions of the plate body which are not masked with the silver doped regions are etched to a certain depth depending upon the etching rate of the etchant used and the etching time (FIG. 9). Furthermore, by dissolving off or peeling the silver doped regions of the selenium-germanium film, the plate body having a relief pattern is obtained according to the given pattern as shown in FIG. 10. In order to dissolve off the silver doped regions of the selenium-germanium film, the use of hot concentrated sulfuric acid is effective. If the plate body is attacked by the hot concentrated sulfuric acid, the removal of the silver doped regions may be performed by immersing in an alkaline solution with a high concentration for a long time.

A further embodiment of the method according to the present invention will be described below. This embodiment is concerned with the formation of a given relief pattern on a laminate composed of a layer to be worked and a layer not to be worked. Such pattern formation is frequently adopted to the manufacture of silicon semiconductor elements or integrated circuits, for example, to the formation of pattern in silicon oxide film, silicon nitride film or aluminum film disposed on a silicon substrate. In this embodiment, the given pattern is formed in the same manner as described in FIGS. 2–7 and FIGS. 8–10. That is, as shown in FIG. 11, silver doped regions 8 of selenium-germanium film are formed on a laminate 11 composed of a layer 12 to be worked and a substrate 13 not to be worked according to the given pattern. Then, only the layer 12 is etched with a suitable etchant (FIG. 12) and finally the silver doped regions are removed to obtain the laminate having a relief pattern according to the given pattern (FIG. 13).

As mentioned above, the radiation sensitive chalcogenide layer according to the present invention acts as a negative resist wherein areas exposed to light or electron beam are remaining and the non-exposed areas are dissolved off by the etching treatment, and is entirely different from the conventional radiation sensitive materials acting as a positive resist as described hereinbefore.

According to the present invention, the selenium-germanium amorphous thin film exhibits a strong acid resistance independently of the presence or absence of the doping silver and is hardly dissolved in various acids such as hydrofluoric acid (HF), a mixed solution of hydrofluoric acid-ammonium fluoride ($NH_4F$)-water as an etchant for silicon oxide film, phosphoric acid ($H_3PO_4$), hydrochloric acid (HCl), sulfuric acid ($H_2SO_4$) at room temperature and the like. Furthermore, the silver doped selenium-germanium film exhibits a resistance to an alkaline solution as well as an acid. Therefore, the pattern formation according to the present invention is widely applicable, for example, in silicon process usually using the acid solution mentioned above and the like.

The invention will be described in greater detail with reference to the following experiments, comparative experiment and examples.

EXPERIMENT 1

A selenium-germanium amorphous thin film having a chemical composition shown in the following Table 1 and a thickness of 0.4 μm was formed on a mirror-polished silicon wafer by a radio-frequency sputtering process and then a silver layer having a thickness of about 80 Å was formed thereon by immersing in an aqueous solution of 30 weight % of silver nitrate at room temperature for one minute to form a specimen of pattern-forming material. Next, the specimen was exposed to a light emitted from 200 watt mercury lamp under such a condition that a part of the specimen is covered with a suitable mask by varying the exposure time within a range of 1 to 600 seconds. The light intensity on the surface of the specimen was 60 mW/cm². After the exposure, the silver layer on the non-exposed area of the selenium-germanium film was dissolved off by etching with aqua regia at room temperature for 8 seconds and then the non-exposed selenium-germanium film was completely dissolved off by etching with an aqueous solution of 6 mol% of ammonia at room temperature according to the aforementioned pattern-forming method. Thereafter, the thickness of the silver doped selenium-germanium film at the exposed area was measured with respect to the specimens having different exposure times to obtain a value of normalized remaining film thickness as a function of exposure time, which is shown by a characteristic curve in FIG. 14.

Moreover, the experimental results with respect to these specimens are shown in Table 1. In Table 1, the term "relative sensitivity" is defined as a relative value of a reciprocal of exposure time required to result in the normalized remaining film thickness of 0.5, when a reciprocal of exposure time corresponding to the normalized remaining film thickness of 0.5 of $Se_{90}Ge_{10}$ is 100, and a value of γ shows a gradient at such a region that the value of the normalized remaining film thickness rapidly changes. The higher the γ value, the higher the contrast as the radiation sensitive layer and hence the higher resolution is obtained. The alkali solubility of the selenium-germanium film was observed during the etching with the above mentioned aqueous alkaline solution.

Table 1

| Chemical composition of Se-Ge film (mol%) | Relative sensitivity | γ | Alkali solubility |
|---|---|---|---|
| $Se_{70}Ge_{30}$ | 7 | 1.3 | good |
| $Se_{75}Ge_{25}$ | 50 | 4.5 | " |
| $Se_{85}Ge_{15}$ | 73 | 4.5 | " |
| $Se_{90}Ge_{10}$ | 100 | 4.5 | " |
| $Se_{95}Ge_{5}$ | ~120 | — | slightly poor |
| $Se_{100}$ | — | — | poor |

In the case of $Se_{95}Ge_5$ film, the value of relative sensitivity could be measured practically, but the γ value was not determined because the state etched with the alkaline solution is slightly poor and hence the value of the normalized remaining film thickness is scattered. In the case of pure Se film, there was not observed the difference of etching rate between the exposed area and the non-exposed area, so that this film is unsuitable as the radiation sensitive layer of the pattern-forming material according to the present invention. In FIG. 14, there are shown the characteristic curves of $Se_{70}Ge_{30}$, $Se_{75}Ge_{25}$ and $Se_{90}Ge_{10}$ films. As seen from the results of Table 1 and FIG. 14, the use of selenium-germanium amorphous thin film having a chemical composition of 75–95 mol% of Se and 5–25 mol% of Ge is preferable as the radiation sensitive layer for the pattern-forming material in view of the sensitivity, contrast and alkali solubility.

EXPERIMENT 2

The exposure property to electron beam was examined with respect to three $Se_{85}Ge_{15}$, $Se_{80}Ge_{20}$ and $SE_{75}Ge_{25}$ amorphous films in the same manner as described in Experiment 1. As a result, the γ value makes little difference among these films and is as high as about 8. Furthermore, the sensitivity tends to increase with the increase of selenium concentration like the case of light exposure.

Figure 15:
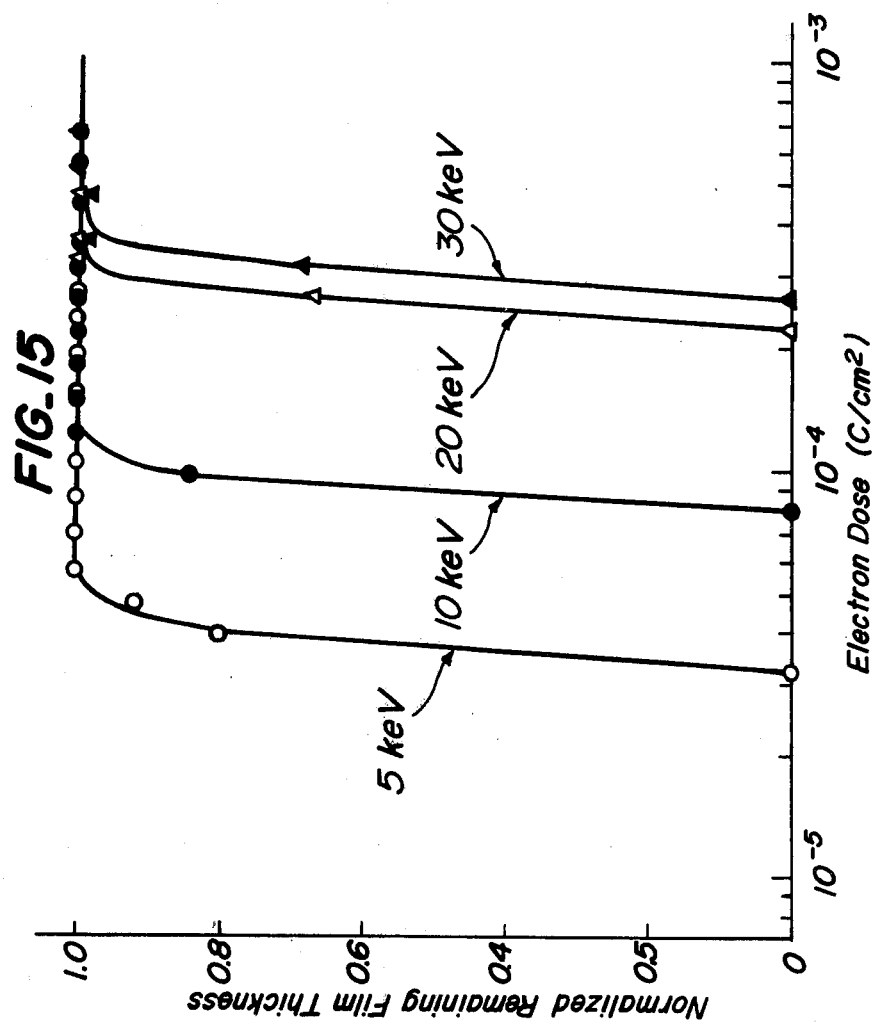
FIG. 15 is a characteristic graph showing a relation between the electron dose and the normalized remaining film thickness of the radiation sensitive chalcogenide layer used in the present invention upon irradiation of electron beam.

The normalized remaining film thickness of the $Se_{85}Ge_{15}$ film was measured by varying the acceleration voltage of electron beam to obtain a characteristic curve shown in FIG. 15. It can be seen from FIG. 15 that the sensitivity increases with the decrease of the acceleration voltage, but the γ value does not rely on the acceleration voltage. Moreover, it has been found that the sensitivity of the $Se_{80}Ge_{20}$ film at 10 KeV is substantially equal to that of the $Se_{85}Ge_{15}$ film at 20 KeV.

COMPARATIVE EXPERIMENT

As the chalcogenide material, the $Se_{75}Ge_{25}$ film according to the present invention, which is the material having a lowest sensitivity in the compositional range of the present invention, was compared with the arsenic trisulfide ($As_2S_3$) film of the prior art on the exposure property and resolution.

Figure 16:
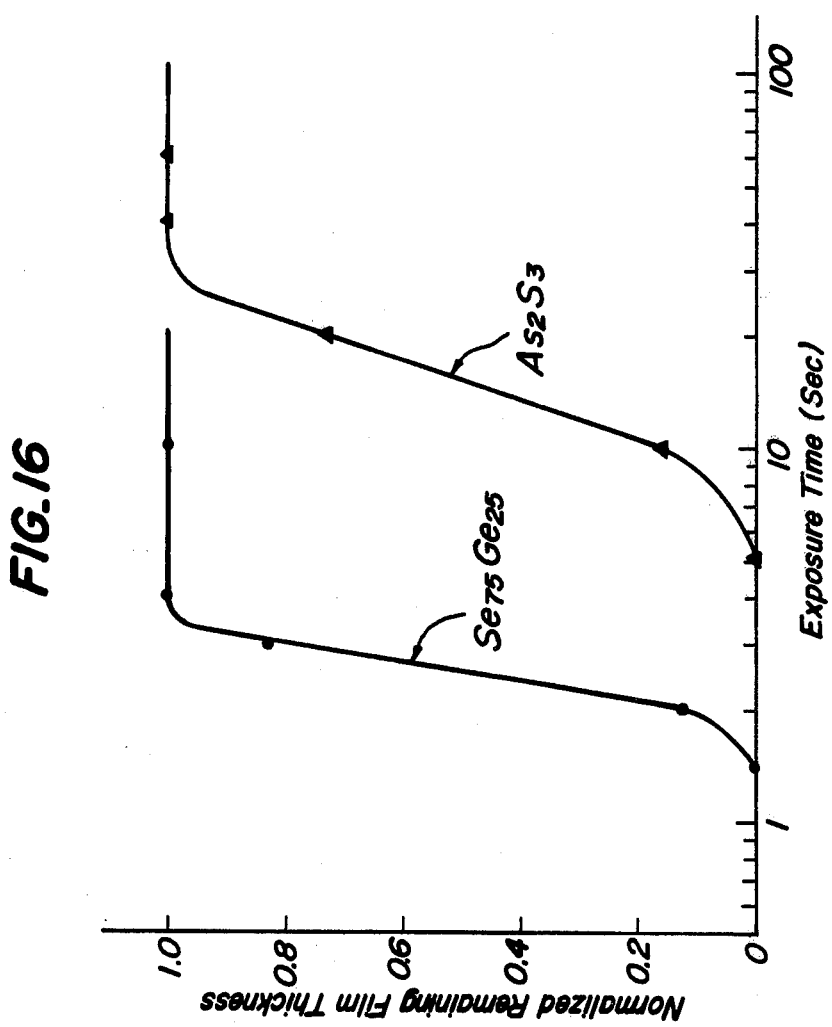
FIG. 16 is a characteristic graph showing a relation between the exposure time and the normalized remaining film thickness in the radiation sensitive chalcogenide materials of the present invention and the prior art upon irradiation of light.

In order to achieve the same experimental conditions, the $Se_{75}Ge_{25}$ and $As_2S_3$ films each having a thickness of 0.5 μm were formed on mirror-polished silicon wafers by vacuum evaporation process, respectively. The exposure property with respect to these films was measured in the same manner as described in Experiment 1. The light was irradiated by using a 500 watt xenon lamp, wherein the light intensity on the surface of the film was about 300 mW/cm². Further, the alkali solubility was measured by using an aqueous solution of 25 weigh % of dimethylamine as an alkaline solution. Moreover, the limit for forming distinct pattern was measured as the resolution by using optical masks having different slits. FIG. 16 shows characteristic curves of the two films relating to the normalized remaining film thickness as a function of exposure time. In the following Table 2, there are shown experimental results of these films relating to the relative sensitivity, $\gamma$ value, resolution and alkali solubility.

Table 2

| Kind of chalcogenide | Relative sensitivity ($Se_{75}Ge_{25}$ = 100) | $\gamma$ | Resolution | Alkali solubility |
| --- | --- | --- | --- | --- |
| $Se_{75}Ge_{25}$ | 100 | 4.5 | $\leq 0.9$ μm | good |
| $As_2S_3$ | 27 | 2.2 | $\geq 3$ μm | poor |

It can be seen from the results of Table 2 and FIG. 16 that the chalcogenide material according to the present invention is superior in the sensitivity, contrast and resolution to the conventional chalcogenide material.

EXAMPLE 1

Selenium and germanium were weighed so as to provide a chemical composition of 75mol% of Se and 25 mol% of Ge and enclosed in an ampoule made of quartz glass under vacuum. This ampoule was held in an electric furnace at 1,000° C. for 12 hours and then rapidly cooled outside the furnace, whereby selenium-germanium amorphous ingot was obtained.

Then, the thus obtained amorphous ingot was deposited as the starting material on a slide glass substrate for an optical microscope at a rate of 2 Å/sec under argon gas atmosphere of 4–5 mmHg by a radio-frequency sputtering process to form an amorphous thin film consisting of 75 mol% of selenium and 25 mol% of germanium and having a thickness of 2,000 Å. This thin film was hard and fine and had the same composition as the starting material as measured by a fluorescent X-ray analysis. Thereafter, the resulting assembly was immersed in an aqueous solution of 30 weight % of silver nitrate held at room temperature for one minute, washed with water and dried to form a silver layer of about 80 Å thickness on the thin film.

Next, the thus obtained assembly was exposed to a light through an optical mask having rectangular light-shading areas of 0.9 μm width and 8 μm length. The light source was a mercury lamp, and the light intensity on the exposed surface was 60 mW/cm², and the exposure time was 30 seconds. After the irradiation of light, the assembly was immersed in an aqua regia held at room temperature for 8 seconds, washed with water and further immersed in a mixed solution of an aqueous solution of 50 weight % of dimethylamine, acetone and water with a volume ratio of 1:1:1 for 30 seconds, whereby the non-exposed areas were completely dissolved off. Thus, holes having a rectangular form of 0.9 μm × 8 μm were formed in the silver doped selenium-germanium film disposed on the slide glass.

EXAMPLE 2

The same procedure as described in Example 1 was repeated with respect to the amorphous film having a chemical composition of 95 mol% of selenium and 5 mol% of germanium. In this case, the exposure time was 10 seconds and the alkaline solution for dissolving off the non-exposed areas of the thin film was a 0.5N aqueous solution of sodium hydroxide. As a result, the same pattern as described in Example 1 was formed.

EXAMPLE 3

An amorphous material having a chemical composition of 80 mol% of selenium and 20 mol% of germanium was prepared in the same manner as described in Example 1. Separately, a silicon oxide film having a thickness of 3,000 Å was formed on a silicon wafer by thermal oxidation with steam and oxygen in an electric furnace at 1,050° C. Then, the amorphous material was deposited on the silicon oxide film under the same conditions as described in Example 1 by a sputtering process to form a selenium-germanium amorphous thin film consisting of 80 mol% of Se and 20 mol% of Ge and having a thickness of 2,000 Å. Thereafter, the formation of silver layer, the exposure treatment and the etching treatment were effected in the same manner as described in Example 1 to form holes having a width of 0.9 μm and a length of 8 μm in the silver doped selenium-germanium film disposed on the silicon oxide film.

Next, the resulting assembly was immersed in a mixed solution of 10 cc of 48% hydrofluoric acid, 40 grams of ammonium fluoride and 60 cc of water for 5 minutes, whereby portions of the silicon oxide film corresponding to the holes, i.e. portions not covered with the silver doped selenium-germanium film were completely dissolved off until the surface of the silicon wafer was exposed. Thereafter, the silver doped selenium-germanium film was completely dissolved off by immersing in a concentrated sulfuric acid at 200° C. for one minute. Thus, holes having a rectangular form of 0.9 μm × 8 μm were formed in the silicon oxide film.

EXAMPLE 4

A silicon nitride film having a thickness of 1,500 Å was formed on a silicon wafer by chemical vapor deposition with silicon tetrahydride and ammonia and then a selenium-germanium amorphous thin film consisting of 75 mol% of Se and 25 mol% of Ge and having a thickness of 3,000 Å was formed thereon in the same manner as described in Example 1. Thereafter, the formation of silver layer, the exposure treatment and the etching treatment were effected in the same manner as described in Example 1 to form holes having a width of 0.9 μm and a length of 8 μm in the silver doped selenium-germanium film disposed on the silicon nitride film. In this case, a mixed solution of an aqueous solution of 25 weight % of ammonia, acetone and water with a volume ratio of 1:1:1 was used as the alkaline solution and the etching time was 50 seconds.

Then, portions of the silicon nitride film corresponding to the holes not covered with the silver doped selenium-germanium film were completely dissolved off by immersing in concentrated phosphoric acid at 150° C. for 10 minutes and further the silver doped selenium-germanium film was removed in the same manner as described in Example 3. Thus, holes having a rectangular form of 0.9 μm × 8 μm were formed in the silicon nitride film.

EXAMPLE 5

An aluminum film having a thickness of 4,000 Å was formed on a silicon wafer by vacuum evaporation and then a selenium-germanium amorphous thin film consisting of 75 mol% of Se and 25 mol% of Ge and having a thickness of 3,000 Å was formed thereon in the same manner as described in Example 1. Thereafter, the formation of silver layer, the exposure treatment and the etching treatment with the aqua regia were effected in the same manner as described in Example 1 and further the etching treatment with the same alkaline solution as used in Example 1 was effected for 50 seconds to form holes of a given pattern in the silver doped selenium-germanium film. Next, portions of the aluminum film corresponding to the holes were completely dissolved off by immersing in a mixed solution of phosphoric acid, acetic acid, nitric acid and water with a volume ratio of 25:5:1:2 at 30° C. for 5 minutes and further the silver doped selenium-germanium film was removed off by immersing in the above alkaline solution at 40° C. for 40 minutes. Thus, holes having a rectangular form of 0.9 $\mu$m $\times$ 8 $\mu$m were formed in the aluminum film disposed on the silicon wafer.

EXAMPLE 6

The same procedure as described in Example 1 was repeated except that a silicon wafer was used instead of the slide glass. Then, the resulting assembly was etched with a mixed solution of hydrofluoric acid and nitric acid with a volume ratio of 1:20 at room temperature for 10 seconds and further the silver doped selenium-germanium film was removed in the same manner as described in Example 3. Thus, holes having a depth of about 1 $\mu$m, a width of 0.9 $\mu$m and a length of 8 $\mu$m were formed in the silicon wafer.

EXAMPLE 7

The amorphous material consisting of 85 mol% of selenium and 15 mol% of germanium was prepared and then deposited on a glass substrate in the same manner as described in Example 1 to form a selenium-germanium amorphous thin film having a thickness of 2,000 Å and thereafter a silver thin layer was formed thereon in the same manner as described in Example 1. Then, the resulting assembly was exposed to an electron beam at an acceleration voltage of 20 KeV according to a pattern of a rectangular form having a width of 0.3 $\mu$m and a length of 10 $\mu$m. In this case, the electron dose was $5 \times 10^{-4}$ C/cm$^2$. After the exposure, the etching treatment was effected in the same manner as described in Example 1 to form portions of the silver doped selenium-germanium film corresponding to the rectangular form of 0.3 $\mu$m $\times$ 10 $\mu$m on the glass substrate.

EXAMPLE 8

A selenium-germanium amorphous thin film consisting of 85 mol% of Se and 15 mol% of Ge and having a thickness of 2,000 Å was formed on a silicon oxide film having a thickness of 2,000 Å and disposed on a silicon wafer in the same manner as described in Example 3 and then a silver thin layer was formed thereon in the same manner as described in Example 1. The resulting assembly was exposed to an electron beam at an acceleration voltage of 10 KeV and a beam current of $4 \times 10^{-9}$ A for 8 seconds according to a pattern of circles having a diameter of 140 $\mu$m. Thereafter, portions of the silver doped selenium-germanium film corresponding to the circles of 140 $\mu$m diameter were formed on the silicon oxide film in the same manner as described in Example 1. Next, portions of the silicon oxide film not covered with the silver doped selenium-germanium film were dissolved off by etching with the same etching solution as used in Example 3 and further the silver doped selenium-germanium film was dissolved off by etching with hot concentrated sulfuric acid. Thus, the portions of the silicon oxide film corresponding to the circles of 140 $\mu$m were left on the silicon wafer.

According to the present invention, the pattern-forming materials having the radiation sensitive chalcogenide layer and the method of forming pattern with such materials have the following merits:

(i) The radiation sensitive chalcogenide layer according to the present invention has a very high resolution when using as a resist material. This results from the facts that the contrast is high - the $\gamma$ value is $\sim$4.5 at light irradiation and $\sim$8 at electron beam irradiation and is larger than that of the organic polymer resists conventionally used, and particularly the $\gamma$ value of $\sim$8 is larger than that of any well-known resists-; that the absorption coefficient of the selenium-germanium film to a near ultraviolet light is high and hence problems at the edge of the pattern such as diffraction of light and scattering of light are mitigated; that there are not caused swelling deformation and heat deformation in the solution; that the resolving power inherent to the selenium-germanium film is high because of amorphous structure; and that the thickness of the selenium-germanium film may be thinned because it has a strong etch resistance to acid solutions.

(ii) It has a wide application because of strong etch resistance to acid solutions. Particularly, the selenium-germanium amorphous thin film exhibits a strong resistance to hot concentrated phosphoric acid, so that it can be used as a mask for etching silicon nitride film which has never been achieved with the conventional organic polymer resist materials.

(iii) The formation of the amorphous thin film is carried out by a sputtering process and the like different from the formation of the conventional resist materials, so that it is easy to uniformly form the amorphous thin film over a large surface area of the substrate and the number of pinholes is few.

(iv) The radiation sensitive chalcogenide layer according to the present invention is hard different from the conventional organic polymer resist materials, so that it is not damaged and has a strong resistance to contamination of dust. Further, this layer is not charged up even under the irradiation of electron beam.

(v) There are various applications. The radiation sensitive chalcogenide layer according to the present invention is hard and has a high absorption coefficient to near ultraviolet light as mentioned above, so that it can be used as a see-through hard photomask. Further, it can be used as a mask for selective ion implantation. Moreover, it is, of course, applicable to the formation of fine relief patterns such as diffraction grating and the like. What is claimed is:

1. A pattern-forming material comprising a radiation sensitive chalcogenide layer disposed on a substrate; said chalcogenide layer consisting of an amorphous layer having a chemical composition of 75 to 95 mol% of selenium and 5 to 25 mol% of germanium and a silver layer superimposed on said amorphous layer.

2. A pattern-forming material as claimed in claim 1, wherein said silver layer is formed by an electroless or an electro-plating process with a solution containing silver ion.

3. The pattern-forming material of claim 1, wherein said silver layer is an electrolessly or an electro-plated layer.

* * * * *